(12) United States Patent
Zhang

(10) Patent No.: US 6,458,200 B1
(45) Date of Patent: Oct. 1, 2002

(54) METHOD FOR FABRICATING THIN-FILM TRANSISTOR

(75) Inventor: Hongyong Zhang, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 08/089,650

(22) Filed: Jul. 12, 1993

Related U.S. Application Data

(63) Continuation of application No. 07/707,092, filed on May 29, 1991, now abandoned.

(30) Foreign Application Priority Data

Jun. 1, 1990 (JP) .............................................. 2-145069

(51) Int. Cl.⁷ .................................................. C30B 1/10
(52) U.S. Cl. .................. 117/9; 117/4; 117/10; 438/486; 438/487; 438/509
(58) Field of Search .......................... 437/40, 173, 174; 438/486, 487, 509; 117/4, 9, 10

(56) References Cited

U.S. PATENT DOCUMENTS

| | | | |
|---|---|---|---|
| 4,174,217 A | | 11/1979 | Flatley |
| 4,266,986 A | * | 5/1981 | Benton et al. |
| 4,727,044 A | * | 2/1988 | Yamazuki ..................... 437/45 |
| 4,743,567 A | * | 5/1988 | Pandya et al. ................. 437/84 |
| 4,769,338 A | * | 9/1988 | Ovshinsky .................... 437/39 |
| 4,885,258 A | * | 12/1989 | Ishihara et al. ........ 437/40 TFT |
| 4,888,305 A | * | 12/1989 | Yamazaki et al. ........... 437/101 |
| 5,162,239 A | * | 11/1992 | Winer et al. .................... 437/4 |
| 5,264,383 A | * | 11/1993 | Young .................. 437/40 TFT |

FOREIGN PATENT DOCUMENTS

| | | | |
|---|---|---|---|
| DE | 3636221 | 4/1988 | |
| EP | 0171509 | 2/1986 | |
| EP | 0301463 | 2/1989 | |
| EP | 0331811 | 9/1989 | |
| JP | 272750 | * 11/1900 | ................. 437/173 |
| JP | 55008026 | 2/1980 | |
| JP | 85262 | * 5/1982 | |
| JP | 14524 | * 1/1983 | ................. 437/174 |
| JP | 58164267 | 9/1983 | |
| JP | 135110 | * 6/1986 | ................. 437/174 |
| JP | 62035571 | 2/1987 | |
| JP | 62039067 | 2/1987 | |
| JP | 62254467 | 11/1987 | |
| JP | 63200572 | 8/1988 | |
| JP | 63250178 | 10/1988 | |
| JP | 63292682 | 11/1988 | |
| JP | 02130912 | 5/1990 | |
| JP | 02228043 | 9/1990 | |

OTHER PUBLICATIONS

*Laser Annealing of Semiconductors*, J.M. Poate–Editor, Academic Press, Inc., 1982, Chapter 13–"Factors Influencing Applications", pp. 479–489.

(List continued on next page.)

*Primary Examiner*—Robert Kunemund
(74) *Attorney, Agent, or Firm*—Eric J. Robinson; Nixon Peabody LLP

(57) ABSTRACT

A process for fabricating thin film transistors is disclosed, which comprises a two-step laser annealing process as follows:

crystallizing the channel portion by irradiating the channel portion with an irradiation beam; and modifying the electric properties of the source and the drain by irradiating the source and the drain with an irradiation beam in a step independent to the first step of crystallizing the channel portion.

21 Claims, 4 Drawing Sheets

OTHER PUBLICATIONS

T. Sameshima et al., "XeCI Excimer Laser Annealing Used to Fabricate Poly–Si TFT's," Japanese Journal of Applied Physics, vol. 28, No. 10, Oct. 1989, pp. 1789–1793.*

K. Scra, et al "High–Performance TFT's Fabricated bx XeCI Excimer Laser Annealing of Hydrogenated Amorphors–Silicon Film" IEEE Transactions on Electron Deviles 36(1989) No. 12 pp. 2868–2872.*

T. Sameshima, et al "XeCl Excimer Laser Annealing Used to Fabricate Poly–Si TFTs" Mat. Res. Symp. Proc. vol. 71 (1986).*

S. Wolf, et al *Silicon Processing for the VLSI Era vol. 1 Process Technology* Lattice Press; Sunset Beach, CA (1986) pp. 175,178–179.*

* cited by examiner

… … …

METHOD FOR FABRICATING THIN-FILM TRANSISTOR

This application is a Continuation of Ser. No. 07/707,092, filed May 29, 1991, now abandoned.

FIELD OF THE INVENTION

The present invention relates to a method for fabricating thin-film transistors (referred to hereinafter as TFT) comprising a thin film of a non-single crystal semiconductor, which are highly reliable and suitable for practical applications such as liquid crystal displays and image sensors.

BACKGROUND OF THE INVENTION

Thin-film transistors (TFTs) made with non-single crystal semiconductor produced by chemical vapor deposition (referred to hereinafter as CVD) processes or the like have become of great interest recently.

Since those TFTs are deposited on an insulating substrate by a CVD process or the like, the process can be advantageously carried out in a temperature as low as about 500° C. or even lower. Thus, the process becomes economical, since it allows the use of low-cost soda-lime glass, borosilicate glass, and the like as the substrate.

The TFTs are typically field effect transistors which function in a manner similar to that of the so-called MOS-FETs (Metal Oxide Silicon Field-Effect Transistors). As mentioned earlier, the TFTs can be deposited at a low temperature, and moreover, the maximum area thereof is limited only by the dimension of the deposition apparatus. Thus, the TFTs can be freely and easily scaled up with respect to their area, and this is a great advantage. Those TFTs are, therefore, promising as switching devices for active matrix-structured liquid crystal displays consisting of a large number of pixels (picture elements), as well as those for one- or two-dimension image sensors and the like.

The TFTs may be subjected to fine machining (patterning) using the well-established technology of photolithography, and thus they may be integrated in the same manner as, for example, the ICs.

A typical structure of the conventional TFTs is schematically shown in FIG. 2.

As shown in FIG. 2, a typical transistor comprises an insulating glass substrate 20, a thin film semiconductor 21 consisting of a non-single crystal semiconductor, a source 22, a drain 23, a source contact 24, a drain contact 25, a gate insulating film 26, and a gate contact 27.

In such TFTs, the current between the source [22] and the drain [23] (the source-to-drain current) can be controlled by applying a voltage to the gate contact [27].

The speed of response of the TFT can be given by the following equation:

$$S = \mu \cdot V / L^2$$

where, L represents the channel length; $\mu$, the carrier mobility; and V, the gate voltage.

The non-single crystal semiconductor layer to be used in the TFTs comprises numerous grain boundaries and the like, and these have greatly reduced the carrier mobility as compared with that of the single crystal semiconductors. The long delay in response ascribed to the low carrier mobility has been a great problem in the non-single crystal semiconductor TFTs. The TFTs using amorphous silicon (referred to hereinafter as a-Si) semiconductors, in particular, were not practically feasible, since the mobility thereof was so low as in the range of about 0.1 to 1 $cm^2 \cdot V^{-1} \cdot sec^{-1}$.

In order to overcome such a problem, it is evident from the equation mentioned earlier that there is required to shorten the channel length or to increase the carrier mobility. There have been made, accordingly, many modifications based on such principle.

Shorter channel length, L, is particularly effective for the purpose, since the speed of response increases proportional to the reciprocal of the square of the L.

In the case of fabricating the TFT on a substrate of large area, however, it is obviously difficult with the present photolithographic technology in view of the precision in processing, product yield, production cost, and the like, to reduce the distance between the drain and the source (which corresponds approximately to the channel length) to 10 $\mu$m or less. In short, no effective means to reduce the channel length of the TFT is established yet.

With respect to the measures of increasing the mobility, $\mu$, of the semiconductor layer itself, there have been taken such a measure as incorporating a polycrystalline semiconductor in the active layer of the TFT. This measure requires a relatively high temperature.

It is also to be noted that in TFTs, the electric current at the channel portion is subject to the materials which the source and the drain assemblies are made of. Thus, the source and the drain assemblies are often made polycrystalline, or some treatment is applied thereto to assure good electric contact with the channel portion.

More specifically, a thin film of polycrystalline silicon may be deposited by CVD at the source and the drain areas, but the CVD process requires the process to be carried out at a temperature of 500° C. or higher. As an alternative process, a treatment may be carried out to assure good contact between the channel portion with the source and the drain. The treatment comprises, after forming semiconductor layers as the drain and the source, incorporating thereto an n-type or a p-type impurity by ion-implantation, and then heat-treating the drain and the source at a temperature in the range of from 500 to 800° C.

Both of the processes above require a relatively high temperature to obtain a favorable TFT; no TFTs produced thoroughly in a low temperature process are yet available.

Ion implantation is used for obtaining good electric contacts between the channel potions and the drain and source portions. However, it is extremely difficult to carry out uniform doping of impurities over a large area by ion implantation. This remains as a great hindrance in the future development of large-area liquid-crystal displays and the like.

SUMMARY OF THE INVENTION

The present invention provides, with view to overcome the problems mentioned earlier, a process for fabricating TFTs at a low temperature.

The present invention provides, accordingly, a process for fabricating thin film transistors, which comprises: crystallizing the channel portion by subjecting the channel portion to an excimer laser beam irradiation; and modifying the electric properties of the source and the drain by subjecting the source and the drain to excimer laser irradiation in a step independent to the first step of crystallizing the channel portion.

The two-step laser annealing process for TFTs according to the present invention is carried out at a low temperature.

In the figures: 1—Substrate; 2—Protective film for the base; 3—Active layer; 4—Source and Drain; 5—Gate insulating film; 6—Contacts for the gate, source, and drain; 7—Channel area.

DETAILED DESCRIPTION OF THE PREFERRED EMBODIMENT

The present invention is now described in detail below referring to an embodiment according to the present invention. It should be understood, however, that the present invention is not to be construed as being limited thereto.

Embodiment 1

FIG. 1 schematically illustrates a process for fabricating a planar-type TFT according to an embodiment of the present invention.

On the surface of the soda-lime glass substrate 1 was deposited a 300 nm thick silicon oxide film as a base protective film 2, by a well known sputtering method. The film deposition was carried out under conditions as follows;

| | |
|---|---|
| Sputter gas | 100% $O_2$ |
| Reaction Pressure | 0.5 Pa |
| RF power | 400 W |
| Temperature of the substrate | 150° C. |
| Rate of film deposition | 5 nm/min. |

On the base protective film 2 on the substrate was further deposited an I-type non-single crystal silicon semiconductor film 3 by a well-known sputtering process at a film thickness of approximately 100 nm. The film deposition was carried out under conditions as follows:

| | |
|---|---|
| Temperature of the substrate | 100° C. |
| Reaction Pressure | 0.5 Pa |
| RF power (13.56 MHz) | 300 W. |

Figure 1A:
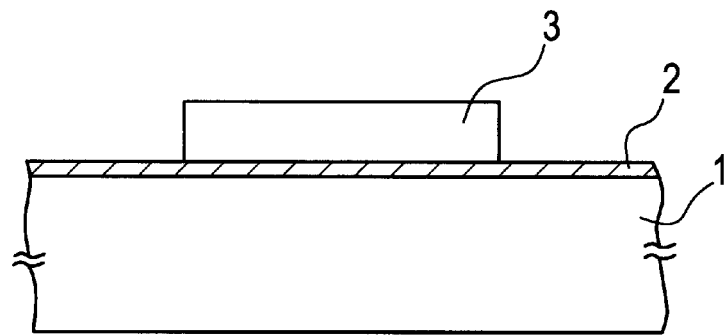
FIGS. 1(A) to 1(C) schematically show the process for fabricating a TFT according to an embodiment of the present invention.

Etching under a predetermined condition was then performed, to thereby obtain an intermediate device structure as shown in FIG. 1(A).

Then, the film 3 was annealed by an excimer laser energy to crystallize the film 3 into a polycrystal. Conditions of the annealing are as follows:

| | |
|---|---|
| Laser energy density | 200 mJ/cm$^2$ |
| Pulse repetition | 50 shots. |

Further on the film 3 was deposited a 50 nm thick n-type non-single crystal silicon film doped-with phosphorus as a low-resistance non-single crystal semiconductor layer. The deposition was carried out by plasma chemical vapor deposition under conditions as follows:

| | |
|---|---|
| Gas materials | $SiH_4 + PH_3 + H_2$ |
| Reaction Pressure | 0.05 Torr |
| Temperature of the substrate | 300° C. |
| RF power (13.56 MHz) | 200 W |
| Film thickness | 50 nm. |

A microcrystalline film with a low electric resistance may be deposited as the n-type non-single crystal silicon film, by incorporating a large amount of $H_2$ gas into the gas materials at an elevated RF power.

Figure 1B:
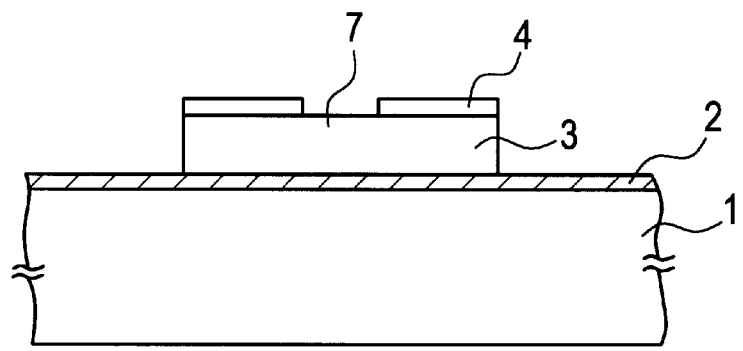

A portion of the n-type non-single crystal silicon film was then removed using a conventional technology of photolithography, leaving out the source and the drain areas 4. Thus was obtained an intermediate device structure as shown in FIG. 1(B).

The n-type non-single crystal semiconductor of the source and the drain 4 was activated by irradiating thereto an excimer laser beam under conditions as follows

| | |
|---|---|
| Laser energy density | 100 mJ/cm$^2$ |
| Pulse repetition | 50 shots. |

The channel portion 7 was then activated by plasma treatment in hydrogen under conditions as follows:

| | |
|---|---|
| Temperature of the substrate | 250° C. |
| RF power | 100 W |
| Duration of the treatment | 60 minutes. |

Figure 1C:
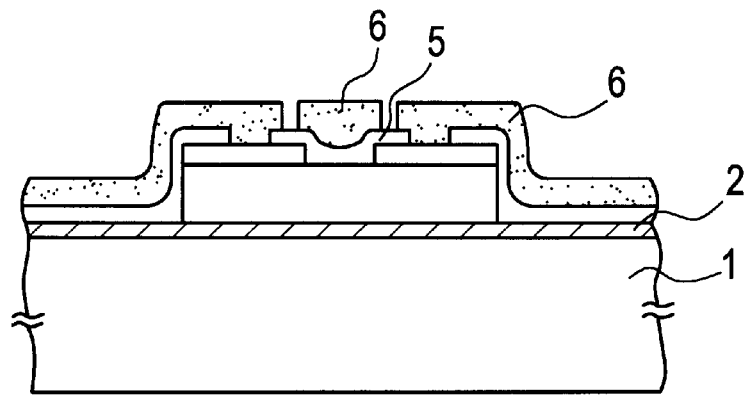
Figure 2:
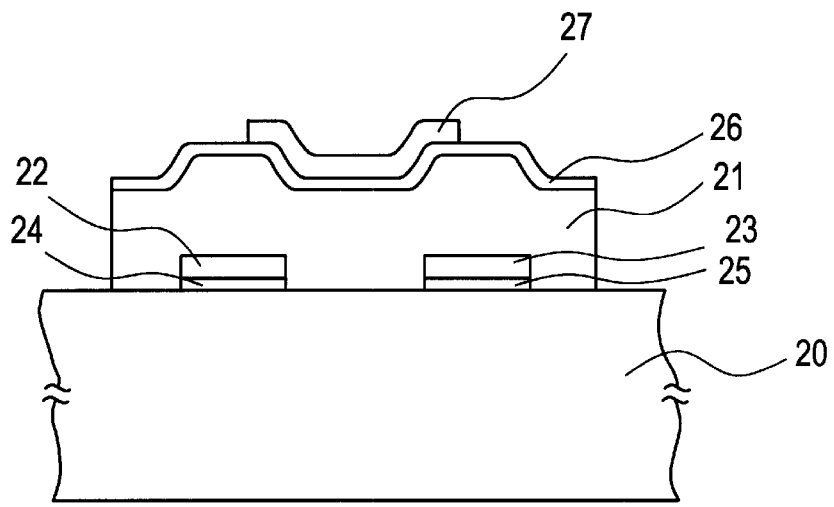
FIG. 2 shows the cross section of a conventional TFT.

On the activated channel were thereafter formed in the order a 100 nm thick gate oxide film 5, source- and drain-contact holes by etching, and an aluminum contact 6, whereby a TFT structure as shown in FIG. 1(C) was obtained. The formation of the gate oxide film was carried out using the same material and method as those used in the deposition of the base protective film 2. The etching of the contact holes was carried out by a method well known in the art.

Figure 3:
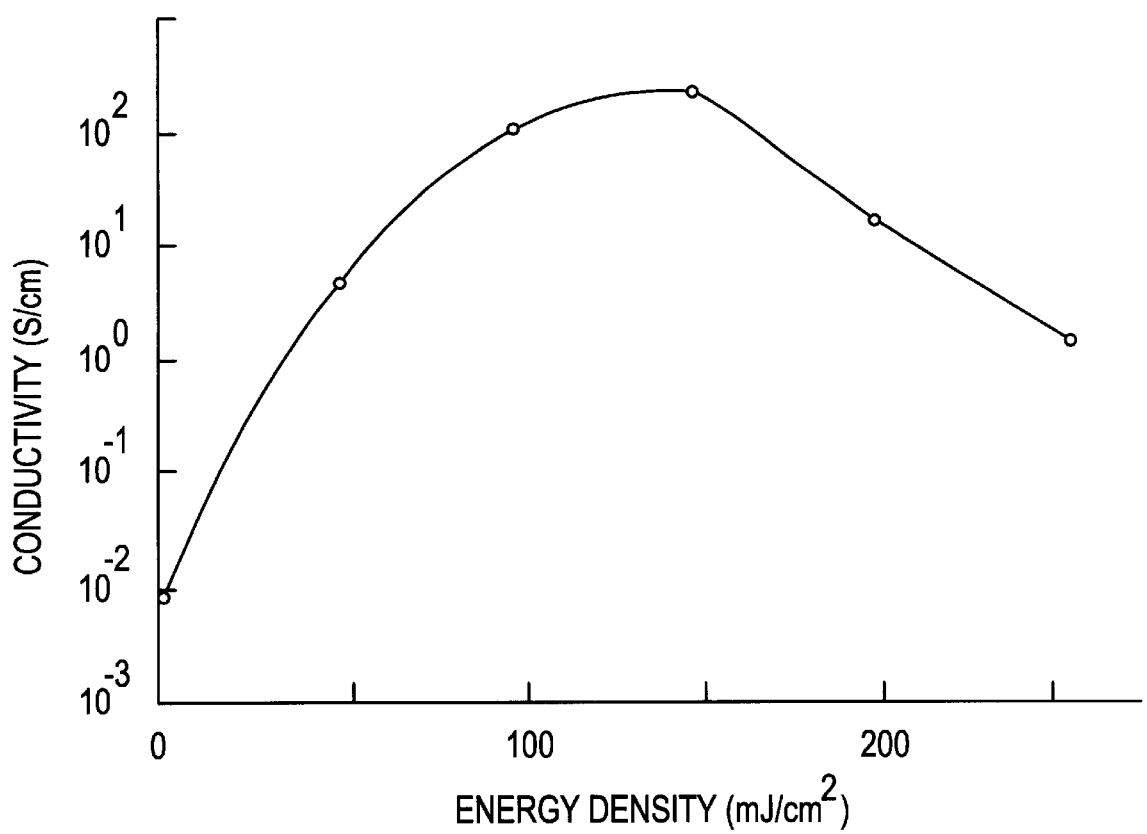
FIG. 3 is a graph showing relationship between conductivity of an n-type layer and a laser energy density.

The conductivity of the source and drain n-type non-single crystal semiconductors 4 changes as a function of energy density of the excimer laser beam irradiated thereto, in a manner shown in FIG. 3.

In FIG. 3, the conductivity of the semiconductors 4 increases with the energy density up to 150 mJ/cm$^2$. However, the conductivity can be seen to decrease with further increasing the energy density since the N$^+$ layer surfaces of the source and drain are damaged by a high energy laser irradiation. With still further increasing the energy density, the source and drain semiconductors 4 are sublimated.

Therefore, the laser irradiation should be controlled to an energy density, preferably, of 150 mJ/cm$^2$ or less, more preferably, in the range of from 100 mJ/cm$^2$ to 10 mJ/cm$^2$. With a laser irradiation with the energy density in the range of from 100 mJ/cm$^2$ to 150 mJ/cm$^2$, a conductivity in the range of from 80 to 200 S/cm can be obtained.

In case a laser beam irradiation with an energy density of 150 mJ/cm$^2$ or less is applied, phosphorus impurities contained in the source and drain 4 do not move from the source and drain 4 to the channel portion because with a laser irradiation with such a low energy density as 150 mJ/cm² or less, the phosphorus impurities stay in the source and drain 4. Therefore, the channel portion is free from degradation by the phosphorus impurities.

Since the channel portion was well crystallized by the laser annealing of the I-type semiconductor film 3, the channel portion is degraded by the laser irradiation of the source and drain semiconductors 4 at an energy density of more than 150 mJ/cm² if the channel portion is not masked. The degradation is caused by stress which is, in turn, caused by the difference between the temperature of the channel portion and that of the other portion of the film 3 during the laser irradiation of the source and drain. However, even if the laser irradiation of the intermediate device structure as shown in FIG. 1(B) is carried out without masking the channel portion, this laser irradiation can be applied without degrading the channel portion if a not so high energy density of 150 mJ/cm² or less is applied.

Figure 4:
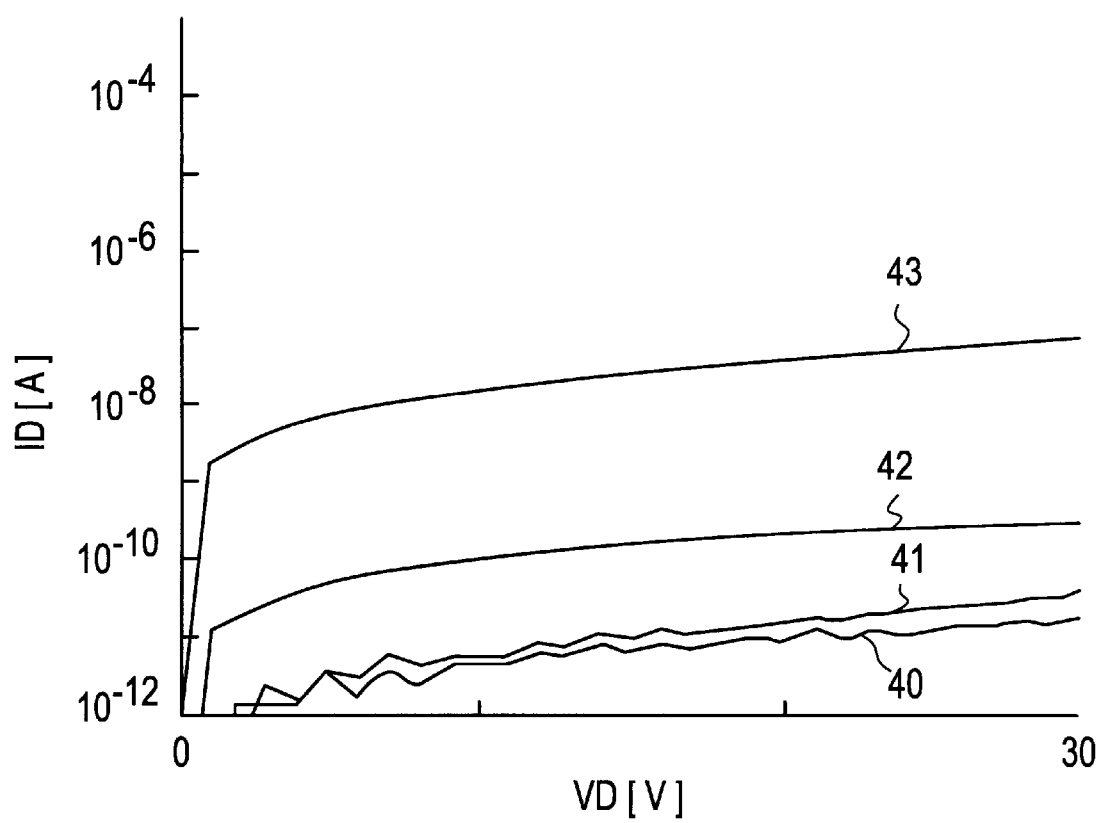
FIG. 4 is a graphical diagram showing the relationship between $I_D$ and $V_D$.
Figure 5:
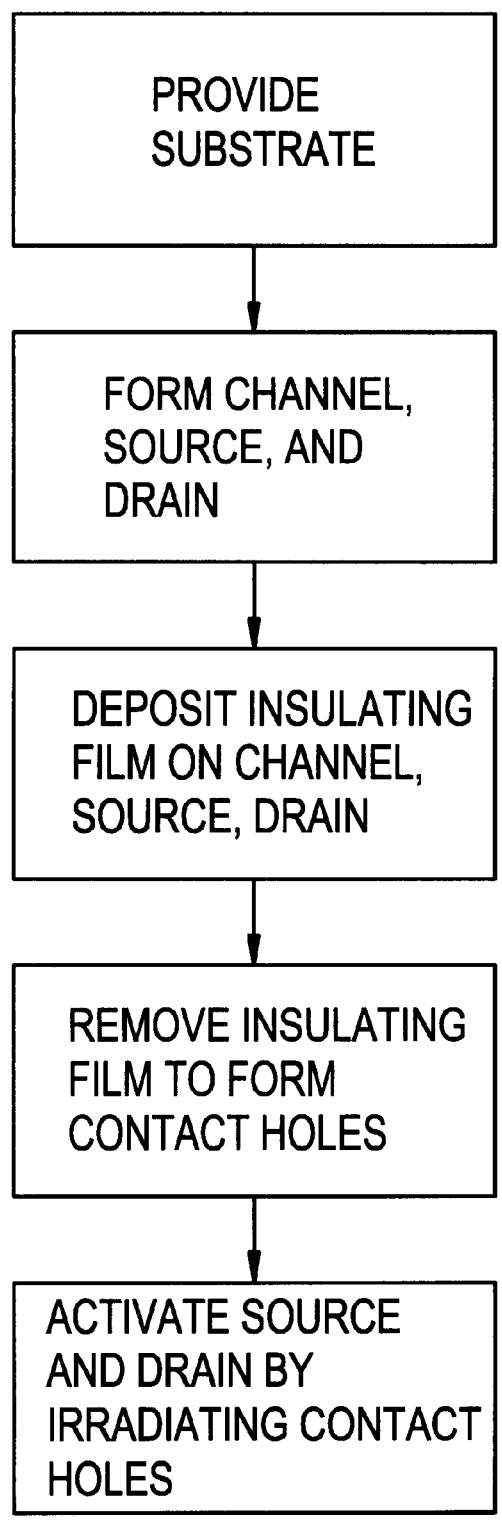
FIG. 5 illustrates a method of manufacturing a thin film transistor in accordance with the present invention.

In this connection, in FIG. 4 is shown the change in the $I_D$-$V_D$ characteristics of the TFT as a function of an energy density of the laser beam irradiation at zero gate potential. In the figure, the abscissa represents the source-to-drain voltage, and the ordinate is for the source-to-drain current; curve (40) shows the $I_D$-$V_D$ characteristics for a case without laser beam irradiation of the source and drain semiconductors, curves (41) to (43) each show the $I_D$-$V_D$ characteristics for the cases in which source and drain semiconductors were irradiated with a laser beam at the energy of 100 mJ/cm², 150 mJ/cm², and 200 mJ/cm², respectively.

From FIG. 4, it can be seen that the OFF current between the source and drain is small and the channel portion suffers little degradation in the case of the laser irradiation of the source and drain semiconductors at an energy of 150 mJ/cm² or lower.

One might consider crystallizing the I-type semiconductor layer 3 while activating the source and the drain in the same single step by irradiating the laser beam for both purposes, however, this is not possible because the laser energy density required for the crystallization and that for the activation is different. If the laser beam energy is set to the optimum condition for the crystallization of the I-type semiconductor layer 3, the sublimation of the source and drain n-type semiconductors or the damage of the source and drain N⁺layer or the degradation of the channel occurs as explained earlier; if the energy is set to the optimum condition for the activation, on the other hand, the I-type semiconductor layer 3 would not crystallize. Thus, the laser irradiation in two steps becomes crucial for the process according to the present invention.

In this Embodiment 1, the gate insulating film 5 was formed after the activation of the n-type source and drain semiconductors 4. In a practical process, however, the order may be reversed. That is, after depositing the gate insulating film 5, a predetermined pattern etching thereof may be performed thereafter, followed by the activation of the source and the drain areas.

In particular, this method of manufacturing a thin film transistor may comprise the steps of: forming an insulating film on channel and source and drain semiconductor regions of said thin film transistor; removing portions of said insulating film to form contact holes on said source and drain regions through said insulating film; and activating said source and drain regions by irradiating said source and drain regions and the remaining portions of said insulating film with an irradiation beam with said remaining portions and masks. The source and drain regions may comprise n-type semiconductors. The insulating film may comprise a layer selected from the group consisting of a silicon oxide layer, a silicon nitride layer, and a multilayer of a silicon oxide layer and a silicon nitride layer. In one embodiment, the upper surface of the channel region may be entirely covered by the remaining portion of the insulating film. The energy density of the irradiation beam may be 150 mJ/cm² or less, and the irradiation beam may be a laser beam or a light beam if desired.

In such a case, the presence of the gate insulating film 5 on the I-type semiconductor film 3 may provide further favorable electric properties to the device since the presence thereof prevents the degradation of the channel portion caused by a laser irradiation.

Thus, it is obvious from the foregoing description that the process according to the present invention enables fabrication of a highly reliable TFT in a low temperature process. The TFT device moreover is of high performance, is furnished with a source and a drain having high electric conductivity, and is less influenced by parasitic resistances.

Furthermore, an excimer laser beam can heat only the surface of a device irradiated therewith. Therefore, a substrate of the device is free from thermal damages and also a high density multilayered device can be made by the use of an excimer laser beam.

The process according to the present invention is further advantageous in that the conventional heat treatment at a high temperature is omitted. Thus, the process restrains impurities present in the substrate from penetrating into the active layers. This realizes TFTs having long stability in the electric properties.

In the process according to an embodiment of the present invention as set forth earlier, a gate insulating film 5 and a base protective film 2 were provided under the source and the drain contacts 6. Since the same material and the same formation method were used for the films 2 and 5, there is little difference between the coefficients of thermal expansion of the films 2 and 5. Therefore, there is caused little difference between the thermal expansion of the film 2 and that of the film 5 by the heat generated during the operation of the TFT or by thermal treatments during the fabrication process. Accordingly, a metal electrode such as an aluminum electrode or the like provided on the uppermost surface of the device is free from peeling off and disconnection. Thus, it can be seen that the process according to the present invention provides TFTs which function for a long period of time with a high reliability.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

For example, in Embodiment 1, a silicon oxide film is used as a gate insulating film (gate oxide film), however, a silicon nitride layer or a multi-layer of a silicon oxide layer and a silicon nitride layer may be used as the gate insulating film instead. An I-type non-single crystal semiconductor film may be an intrinsic semiconductor film or a substantially intrinsic semiconductor film. The substantially intrinsic semiconductor film contains impurities at a concentration less than that of the source and drain n-type semiconductors. An irradiation beam, for example a light beam or a YAG laser beam or the like, may be used for crystallizing the I-type non-single crystal semiconductor film instead of an excimer laser beam. An irradiation beam, for example a light beam or a YAG laser beam or the like, may be used for activating source and drain n-type semiconductors instead of an excimer laser beam. The light beam may be emitted from a halogen lamp or a Xe lamp.

What is claimed is:

1. A method of manufacturing a thin film transistor comprising the steps of:
   forming a first non-single crystal semiconductor layer on a substrate;
   crystallizing said non-single crystal semiconductor layer by irradiating said layer with an excimer laser light;
   depositing a second non-single crystal semiconductor layer having an impurity conductivity type to form source and drain regions on the crystallized semiconductor layer; and
   irradiating said second non-single crystal semiconductor layer with a halogen or Xe lamp light in order to activate an impurity contained in said second semiconductor layer.

2. The method of claim 1 further comprising the step of patterning said second semiconductor layer into the source and drain regions before irradiating the second light beam.

3. The method of claim 1 wherein the energy density of said second light beam is 150 mJ/cm$^2$ or less.

4. The method of claim 1 wherein said second semiconductor layer has an n-type conductivity.

5. The method of claim 1 wherein said first non-single crystal semiconductor layer comprises an intrinsic semiconductor.

6. The method of claim 1 wherein said first and second semiconductor layers are formed by vapor phase deposition, respectively.

7. The method of claim 1 wherein said first non-single crystal semiconductor layer comprises a substantially intrinsic semiconductor.

8. The method of claim 1 wherein either or both of said first and second light beams is/are emitted from a laser.

9. A method of manufacturing a thin film transistor comprising source and drain semiconductor regions and a channel region therebetween, said method comprising the steps of:
   forming a silicon oxide film on a glass substrate;
   forming a semiconductor layer comprising a channel region on said silicon oxide layer;
   crystallizing said channel region by an excimer laser light;
   depositing a second semiconductor layer having an impurity conductivity type to form source and drain regions on said semiconductor layer; and
   activating said source and drain regions by irradiating said source and drain regions with a halogen or Xe lamp light.

10. A method of manufacturing a thin film transistor having at least a channel region formed within a semiconductor layer on a substrate, and source and drain regions adjacent to said channel region and formed on said semiconductor layer, said method comprising the steps of:
    crystallizing the channel region by an excimer laser light;
    activating said source and drain region by irradiating said source, drain and channel regions with a halogen or Xe lamp light,
    wherein said irradiation of said source, drain and channel regions with the halogen or Xe lamp light is carried out without masking said channel region.

11. The method of claim 9 wherein said source and drain regions comprise n-type semiconductors.

12. The method of claim 9 wherein said first and second irradiation beams are laser beams.

13. The method of claim 9 wherein said first irradiation beam and said second irradiation beam are excimer lasers.

14. The method of claim 9 further comprising annealing said channel region with hydrogen.

15. A method of forming a thin film transistor comprising the steps of:
    forming a non-single crystalline semiconductor film including a channel region therein in the form of an island;
    crystallizing said non-single crystalline semiconductor film by irradiating said film with an excimer laser light;
    forming source and drain semiconductor regions containing an impurity of one conductivity type with said channel region interposed therebetween;
    activating said impurity contained in source and drain semiconductor regions by irradiating said regions with a halogen or Xe lamp light; and
    forming a gate insulating layer on said non-single crystalline semiconductor film.

16. A method of forming a thin film transistor comprising the steps of:
    forming a non-single crystalline semiconductor film including a channel region therein in the form of an island;
    crystallizing said non-single crystalline semiconductor film by irradiating said film with an excimer laser light;
    forming source and drain semiconductor regions containing an impurity of one conductivity type, with said channel region interposed therebetween;
    forming an insulating layer over said non-single crystalline semiconductor film and said source and drain semiconductor regions; and
    activating said impurity contained in said source and drain regions by irradiating said regions with a halogen or Xe lamp light.

17. A method of forming a thin film transistor comprising the steps of:
    forming a non-single crystalline semiconductor film including a channel region therein in the form of an island;
    crystallizing said non-single crystalline semiconductor film by irradiating said film with an excimer laser light; and
    forming source and drain semiconductor regions containing an impurity of one conductivity type, with said channel region interposed therebetween; and
    activating said impurity by a halogen or Xe lamp light.

18. A method of manufacturing a semiconductor device comprising the steps of:
    forming a silicon oxide film of a glass substrate;
    forming a non-single crystalline semiconductor film including at least a channel region on said silicon oxide film;
    crystallizing said semiconductor film by irradiating said film with a an excimer laser light; and then
    exposing said semiconductor film to a halogen or Xe lamp light.

19. The method of claim 18 wherein at least one of said first and second laser lights is irradiated in such a manner that a plurality of shots are directed to said semiconductor film.

20. The method of claim 19 wherein said non-single crystalline semiconductor film comprises intrinsic silicon.

21. The method of claim 19 further comprising the step of annealing said semiconductor film with hydrogen.

* * * * *